United States Patent [19]

Lee

[11] Patent Number: 5,050,214
[45] Date of Patent: Sep. 17, 1991

[54] REMOTE CONTROL CIRCUIT

[75] Inventor: Kyu-An Lee, Suwon-city, Rep. of Korea

[73] Assignee: SamSung Electronics Co., Ltd., Suwon, Rep. of Korea

[21] Appl. No.: 608,359

[22] Filed: Nov. 23, 1990

Related U.S. Application Data

[62] Division of Ser. No. 395,506, Aug. 18, 1989, Pat. No. 5,001,774.

[30] Foreign Application Priority Data

Aug. 23, 1988 [KR] Rep. of Korea ............... 10715/1988

[51] Int. Cl.⁵ .............................................. H04R 5/02
[52] U.S. Cl. ........................................ 381/25; 381/74; 381/28; 381/105; 381/109
[58] Field of Search .................. 381/28, 109, 105, 104, 381/74, 25, 107

[56] References Cited

U.S. PATENT DOCUMENTS 4,433,209  2/1984  Kurosawa et al. .................... 381/25
4,829,571  5/1989  Kakiuchi et al. ..................... 381/25

FOREIGN PATENT DOCUMENTS 0237798  11/1985  Japan ..................................... 381/74

Primary Examiner—Forester W. Isen
Attorney, Agent, or Firm—Robert E. Bushnell

[57] ABSTRACT

A remote control circuit for remotely controlling a power source and a volume of a main set from a stereo-headphone composed of a remote control transmitting circuit arranged in a headphone, and a remote control receiving circuit arranged in a mainset.

21 Claims, 2 Drawing Sheets

AN EQUIVALENT CIRCUIT WHEN Q₁ IS ON

AN EQUIVALENT CIRCUIT WHEN Q₁ IS OFF

REMOTE CONTROL CIRCUIT

This is a divisional of application Ser. No. 07/395,506, filed Aug. 18, 1989 now, U.S. Pat. No. 5,001,774.

BACKGROUND OF THE INVENTION

The present invention relates generally to a remote control circuit which is used in a stereo cassette and a type of sounder and, more particularly, to a remote control circuit for remotely controlling a power source and a volume of a main set from a stereo headphone.

In most stereo sounders, it is known that the sound volume is controlled from a main machinery when we are listening with headphones.

As is well known in the art, although the headphone itself has a volume, the main set volume is separately operated when a volume of a mainset is lowest, the main power is not operated from a headphone and is manually operated.

In U.S. Pat. No. 4,435,844 there is disclosed a remote control circuit which minimizes a voltage dropped from a remote control unit. Furthermore, this art doesn't remotely control, a power source but directly controls a main power.

The invention accordingly comprises 4 terminal-type headphones which added one terminal from prior 3 terminal-type headphones, an additional terminal controls a power source and a volume of a main set. A circuit which performs such a function is arranged in a headphone, said circuit provides a remote control circuit arranged in a power switching section and a volume impedance control section of a mainset.

SUMMARY OF THE INVENTION

The principal object of the invention is the device of an improved remote control circuit for remotely controlling a power source and a volume of a main set from a stereo-headphone.

With this object in view, the invention is a remote control circuit of the sounder using a stereo-headphone including an on-off headphone switch SW1 for a main power so as to remotely control a powr and a volume of a mainset from a headphone; the variable resistors VR1, VR2 for controlling the volume of the left-right headphone; a 4 terminal-type headphone jack associated with the connection terminal of the switch SW1 and other connection terminals a,b,d of the variable resistors VR1, VR2; a jack holder 200 associated with the connection jack of the headphone; the switching transistors Q3,Q4 for controlling a power source supplying a power to a mainset by switching actuation according to the operation of the on-off headphone switch SW1 for a main power; the volume impedance control transistors Q1,Q2 for switching a volume impedance through a main amplifier when the volume control variable resistors of a headphone or the volume control variable resistors arranged in a mainset are operated; and a switch SW2 for operating a main set by Remote or Normal.

A preferred embodiment of the invention will now be described, by way of example only, with reference to the accompanying drawings, in which:

DETAILED DESCRIPTION OF THE PREFERRED EMBODIMENT

Figure 1:
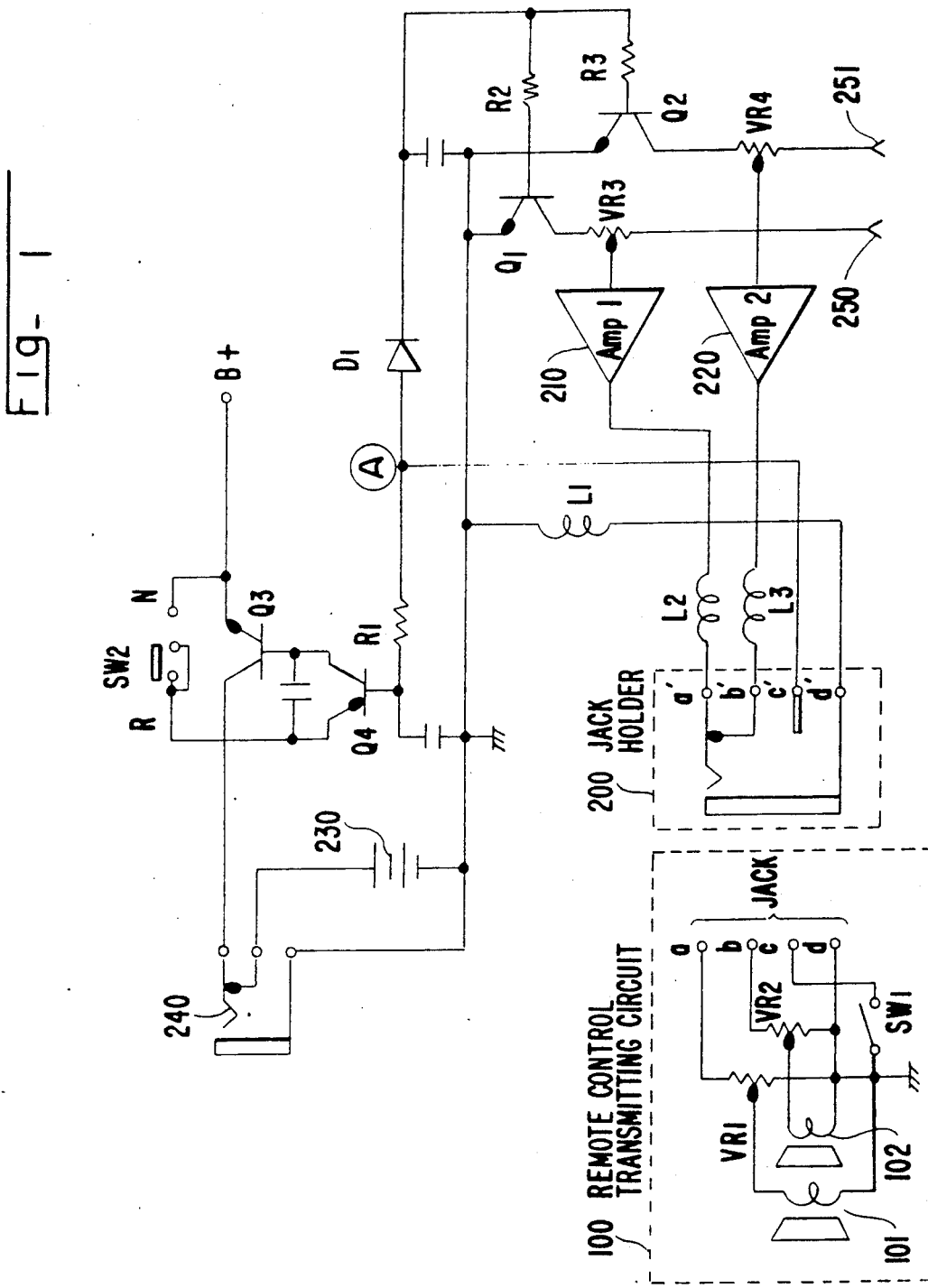
FIG. 1 is a ciruit diagram of the invention.

Referring now to the drawings, and particularly to FIG. 1, the circuit diagram of the invention illustrated therein is composed of a remote control transmitting circuit for transmitting arranged in a headphone, and a remote control circuit for receiving transmissions from the headphone arranged in a mainset.

The remote control transmitting circuit 100 is composed of the volume control variable resistors VR1, VR2 connected to the left-right headphone speakers 101, 102, the power on-off switch SW1 connected to the common connection terminal of the variable resistors VR1, VR2, and a 4 terminal-type headphone connection jack consisting of other side coupling terminals a,b,d of the variable resistor VR1, VR2 and the coupling terminal C of the switch SW1.

The remote control receiving circuit is composed of a jack holder 200 connected to the headphone connection jack, a main amplifiers 210, 220 connected to respective coils L2, L3 through the terminals a', b' of the jack holder 200, the volume control variable resistors VR3, VR4 modulating left-right sound signal; 250, 251, the transistors Q1,Q2 adjusting the impedance of the variable resistors VR3,VR4, the battery 230 coupling to the D.C power source coupling terminal 240, and the transistors Q3, Q4 for switching the D.C. power source, the bases of said transistors Q1 and Q2 are connected to D.C power through respective resistors R2, R3. The base of the transistor Q3 is connected to the collector of Q4, the base of Q4 is connected to Q2 through a bias resistor R1 and a diode D1.

Alternatively, the switch SW2 for converting the remote and the normal function is associated with the collector and the emitter of transistor Q3, the terminal C1 of the jack holder 200 is associated with the base of Q4 for controlling a power source, the terminal d' is associated with the D.C. power connection jack 240 through coil L1.

Figure 2:
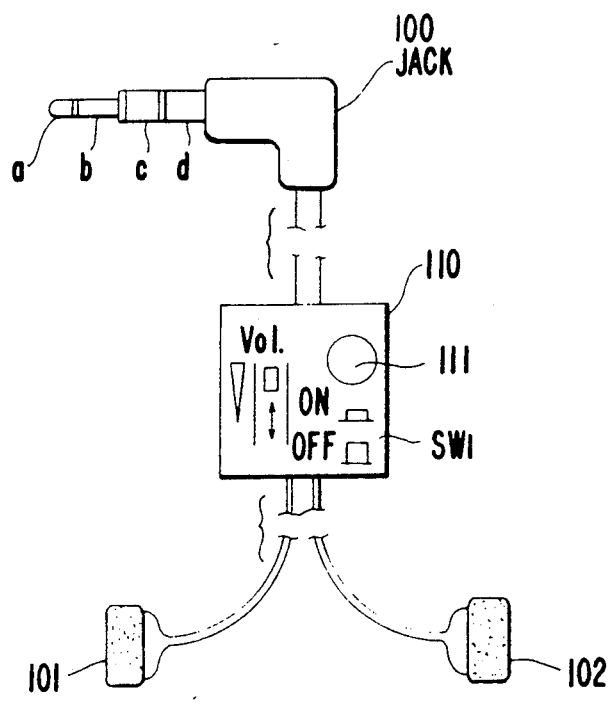
FIG. 2 is a construction view of a headphone jack according to the invention.

FIG. 2 is a schematic diagram of a headphone 100 according to the invention wherein a headphone jack has 4 terminals a,b,c,d and a remote control 110 is composed of a volume control Switch and a power on-off switch SW1 and a luminous diode 111 for displaying the state of on-off power source.

An operation of the present invention will be described with specific reference to FIG. 1 through FIG. 3.

First, in case the mainset is operated through a remote control, the remote or the normal switching device SW2 is set to a remote position R.

At this time, the power source which is supplied from the battery 230 or D.C-jack is applied to the collector of the transistor Q3 and the emitter of the transistor Q4. Therefore, in case that the A contact associated with the base of Q4 is high voltage, the transistor Q4 is off. Therefore if the base of the transistor Q3 is low, Q3 is off. Accordingly, the main set is not supplied D.C. power source B+.

At this time if the power on-off switch SW1 arranged in a headphone 100 is on, the high voltage of the A contact is grounded through the c contact of the connection jack and the switch SW1. Therefore, the base of the transistor Q4 is applied low voltage, as a result, the transistor Q4 is turned on.

Accordingly, as the transistor Q4 is turned on, the base of Q3 is applied high voltage. Furthermore, as the transistor Q3 is also turned on, the main set is normally supplied the power source Alternatively, when the switch SW1 is on and the power B+ is supplied to the main set, the A contact is low, therefore the low potential is applied to the base of transistors Q1, Q2 consequently, the transistors Q1, Q2 are off.

Being turned off the transistors Q1,Q2 adjust the volume with exterior volume control variable resistors VR1, VR2 without relating to the volume control variable resistors VR3, VR4 arranged in a mainset. The volume control variable resistors VR1, VR2 are operated as follows.

Figure 3A:
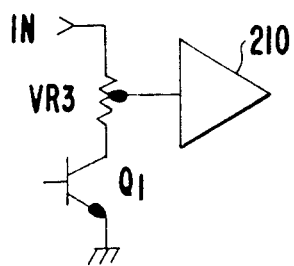
FIGS. 3A-3C are an equivalent circuit diagram when the transistor Q1 is operated.
Figure 3B:
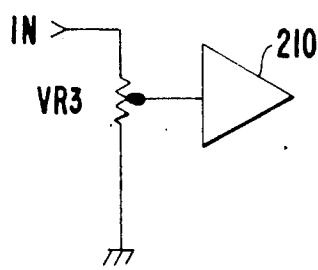
Figure 3C:
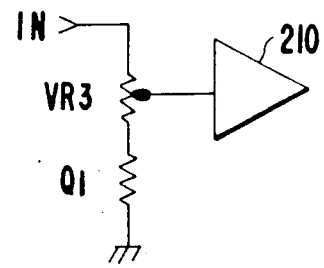

That is, as shown from FIG. 3, if the transistor Q1 is off, the impedance of Q1 is maximum, thus, the input signal of a main amplifier is output as it is without relating to the variable resistor VR3. The reason why the impedance is infinity $\infty$ when the transistor Q1 is off is that the value(for example, about 10R) of the variable resistor VR3 is neglected. On the other hand, it may be seen that transistor Q2 and variable resistor VR4 are operated in the same manner.

Accordingly, a power can be supplied to a main set by actuation of switch SW1, the sound volume can be controlled by volume control variable resistors VR1, VR2 without relating to volume control variable resistors VR3, VR4 arranged in a headphone.

In turn, in case that the main set is operated for normal function, the switch SW2 is set on Normal position. If the switch SW2 is on, a power is supplied to a main set without relating to on-off switch SW1, and if the switch SW1 is off, transistors Q1,Q2 are turned on because the high potential of the A contact is applied to the base of the transistors Q1, Q2. The volume control of a left signal 250 and a right signal 251 is performed by the volume control variable resistors VR3, VR4 arranged in a main set.

The invention improves 3 terminal-type headphone construction and thus arranges interior power control and interior volume impedance control device, and is not only applied to a pocket-stereo sounder but also a radio/cassette. Many modifications and variations of the present invention are possible and it is intended to cover all such as fall within the spirit and scope of the appended claims.

What is claimed is:

1. A remote control circuit of a stereo-headphone, comprising:
   a headphone switch for, during a first mode remotely controlling from said stereo-headphone, power of a main set, and for shifting control to the headphone of volume of stereophonic audio signals amplified by the main set;
   a first plurality of variable resistors for separately controlling volume of different ones of said stereophonic audio signals in said stereo-headphone during said first mode;
   a four terminal headphone coupler associated with a common terminal of said headphone switch and other connection terminals for said first plurality of variable resistors;
   a second coupler configured to engage and provide electrical connection with headphone coupler;
   switching means for controlling flow of the power to the main set during said first mode in dependence upon operation of said headphone switch;
   volume impedance control means for switching control of the volume of the stereophonic audio signals transmitted by a main amplifier, between said first plurality of variable resistors of the headphone and a second plurality of variable resistors coupled in the main set for separately controlling volume of said different ones of said audio signals, in dependence upon said headphone switch; and
   a second switch coupled to said switching means for switching the main set between said first mode and a second mode.

2. A stereophonic audio circuit, comprising:
   means for amplifying stereophonic input signals to provide stereophonic intermediate signals;
   a plurality of audio speakers connected to propagate aural sounds in dependence upon said stereophonic intermediate signals;
   first control means connectable between said plurality of audio speakers and said amplifying means, for varying impedance between said plurality of audio speakers and said amplifying means during a first mode;
   second control means coupled to said amplifying means, for controlling amplitudes of said stereophonic intermediate signals during a second mode;
   first switching means connectable to said second control means, for switching the audio circuit between said first mode and said second mode; and
   second switching means connected to said plurality of audio speakers, for enabling propagation of stereophonic aural sounds during said first mode, and for substantially disenabling said second control means from controlling amplitudes of said aural sounds during said first mode.

3. The circuit of claim 2, further comprised of:
   a first coupler having a first lead connected to receive a first one of said stereophonic intermediate signals, a second lead connected to receive a second one of said stereophonic intermediate signals, and third and fourth leads connected to said second control means.

4. The circuit of claim 2, further comprised of:
   said first control means having first and second variable impedances coupled to different ones of said plurality of audio speakers;
   said first and second variable impedances being coupled to said second switching means at a first node; and
   a first coupler having a first terminal connected to said first node, a second terminal connected to said first node via said first variable impedance, a third terminal connected to said first node via said second impedance, and a fourth terminal connected to said first node via said second switching means.

5. The circuit of claim 4, wherein said second control means is further comprised of:
   third and fourth variable impedances coupled to receive different ones of said stereophonic input signals; and
   third and fourth switching means each having control terminals connected to said first terminal, for varying impedances between corresponding ones of said third and fourth variable impedances and said fourth terminal in dependence upon said second switching means.

6. The circuit of claim 4, further comprised of: a second coupler having a first lead connected to receive a first one of said stereophonic intermediate signals and disposed to engage said second terminal, a second lead connected to receive a second one of said stereophonic intermediate signals and disposed to engage said third terminal, a third lead connected to said second control means and disposed to engage said first terminal, and a fourth lead connected to said second control means and disposed to engage said fourth terminal.

7. The circuit of claim 2, further comprised of:
third control means connected between said first and second switching means, for controlling supply of power to the audio circuit in dependence upon said second switching means.

8. The circuit of claim 7, further comprised of:
a first coupler having a first lead connected to receive a first one of said stereophonic intermediate signals, a second lead connected to receive a second one of said stereophonic intermediate signals, a third lead connected between said second and third control means, and a fourth lead connected to said second control means.

9. The circuit of claim 7, further comprised of:
said first control means having first and second variable impedances coupled to different ones of said plurality of audio speakers;
said first and second variable impedances being coupled to said second switching means at a first node; and
a first coupler having a first terminal connected to said first node, a second terminal connected to said first node via said first variable impedance, a third terminal connected to said first node via said second impedance, and a fourth terminal connected to said first node via said second switching means.

10. The circuit of claim 7, further comprised of:
a second coupler having a first lead connected to receive a first one of said stereophonic intermediate signals and disposed to engage said second terminal, a second lead connected to receive a second one of said stereophonic intermediate signals and disposed to engage said third terminal, a third lead connected between said second and third control means and disposed to engage said first terminal, and a fourth lead connected to said second control means and disposed to engage said fourth terminal.

11. The circuit of claim 9, wherein said second control means is further comprised of:
third and fourth variable impedances coupled to receive different ones of said stereophonic input signals; and
third and fourth switching means each having control terminals connected to said third lead, for varying impedances between corresponding ones of said third and fourth variable impedances and said fourth lead in dependence upon said second switching means.

12. The circuit of claim 2, wherein said second control means is further comprised of:
first and second variable impedances coupled to receive different ones of said stereophonic input signals; and
third and fourth switching means each having control terminals connected to one side of said second switching means for varying impedances between corresponding ones of said first and second variable impedances and a second side of said second switching means in dependence upon said second switching means.

13. A stereophonic audio circuit, comprising:
means for separately amplifying first and second input signals to provide respective first and second intermediate signals;
a plurality of audio headphone speakers connected to propagate aural sounds in dependence upon respective ones of said first and second intermediate signals;
first control means connectable between said plurality of audio headphone speakers and said amplifying means, for varying impedance between said plurality of audio headphone speakers and said amplifying means during a first mode;
second control means coupled to said amplifying means, for controlling amplitudes of said first and second intermediate signals during a second mode;
first switching means connectable to said second control means, for switching the audio circuit between said first mode and said second mode; and
second switching means connected to said plurality of audio headphone speakers, for enabling propagation of said aural sounds during said first mode, and for substantially disenabling said second control means from controlling amplitudes of said aural sounds during said first mode.

14. The circuit of claim 13, further comprised of:
third control means connected between said first and second switching means, for controlling supply of power to the audio circuit in dependence upon said second switching means.

15. The circuit of claim 13, further comprised of: said first control means having first and second variable impedances coupled to different ones of said plurality of audio headphone speakers;
said first and second variable impedances being coupled to said second switching means at a first node; and
a first coupler having a first terminal connected to said first node, a second terminal connected to said first node via said first variable impedance, a third terminal connected to said first node via said second impedance, and a fourth terminal connected to said first node via said second switching means.

16. The circuit of claim 13, further comprised of:
a first coupler having a first lead connected to receive said first one of said intermediate signals, a second lead connected to receive second one of said intermediate signals, and third and fourth leads connected to said second control means.

17. The circuit of claim 15, further comprised of: a second coupler having a first lead connected to receive a first one of said intermediate signals and disposed to engage said second terminal, a second lead connected to receive a second one of said intermediate signals and disposed to engage said third terminal, a third lead connected to said second control means and disposed to engage said first terminal, and a fourth lead connected to said second control means and disposed to engage said fourth terminal.

18. The circuit of claim 14, further comprised of: said first control means having first and second variable impedances coupled to different ones of said plurality of audio headphone speakers;
said first and second variable impedances being coupled to said second switching means at a first node; and a first coupler having a first terminal connected to said first node, a second terminal connected to said first node via said first variable impedance, a third terminal connected to said first node via said second impedance, and a fourth terminal connected to said first node via said second switching means.

19. The circuit of claim 14, further comprised of:
a first coupler having a first lead connected to receive said first one of said intermediate signals, a second lead connected to receive said second one of said intermediate signals, a third lead connected between said second and third control means, and a fourth lead connected to said second control means.

20. The circuit of claim 18, further comprised of:
a second coupler having a first lead connected to receive said first one of said intermediate signals and disposed to engage said second terminal, a second lead connected to receive said second one of said intermediate signals and disposed to engage said third terminal, a third lead connected between said second and third control means and disposed to engage said first terminal, and a fourth lead connected to said second control means and disposed to engage said fourth terminal.

21. The circuit of claim 13, wherein said second control means is further comprised of:
first and second variable impedances coupled to receive different ones of said first and second input signals; and
third and fourth switching means each having control terminals connected to one side of said second switching means for varying impedances between corresponding ones of said first and second variable impedances and a second side of said second switching means in dependence upon said second switching means.

* * * * *

UNITED STATES PATENT AND TRADEMARK OFFICE
CERTIFICATE OF CORRECTION

PATENT NO. : U.S. 5,050,214
DATED : 17 September 1991
INVENTOR(S) : Kyu An LEE It is certified that error appears in the above-identified patent and that said Letters Patent is hereby corrected as shown below:

Column 1,   Line 25,   delete the comma;

Line 45,   change "powr" to --power--;

Line 67,   change "ciruit" to --circuit--;

Column 2,   Line 25,   delete "a";

Signed and Sealed this

Twelfth Day of January, 1993

*Attest:*

DOUGLAS B. COMER

*Attesting Officer*       *Acting Commissioner of Patents and Trademarks*